US009447499B2

(12) United States Patent
Roy et al.

(10) Patent No.: US 9,447,499 B2
(45) Date of Patent: Sep. 20, 2016

(54) DUAL PLENUM, AXI-SYMMETRIC SHOWERHEAD WITH EDGE-TO-CENTER GAS DELIVERY

(75) Inventors: Shambhu N. Roy, Fremont, CA (US); Vincent E. Burkhart, Cupertino, CA (US); Natan Solomon, Sunnyvale, CA (US); Sanjay Gopinath, Fremont, CA (US); Kaihan Abidi Ashtiani, Cupertino, CA (US); Bart van Schravendijk, Sunnyvale, CA (US); Jason Stevens, Los Altos, CA (US); Dhritiman Subha Kashyap, Bangalore (IN); David Cohen, San Jose, CA (US)

(73) Assignee: Novellus Systems, Inc., Fremont, CA (US)

( * ) Notice: Subject to any disclaimer, the term of this patent is extended or adjusted under 35 U.S.C. 154(b) by 902 days.

(21) Appl. No.: 13/531,254

(22) Filed: Jun. 22, 2012

(65) Prior Publication Data

US 2013/0341433 A1 Dec. 26, 2013

(51) Int. Cl.
*B05B 1/14* (2006.01)
*C23C 16/455* (2006.01)

(52) U.S. Cl.
CPC ... *C23C 16/45565* (2013.01); *C23C 16/45574* (2013.01)

(58) Field of Classification Search
None
See application file for complete search history.

(56) References Cited

U.S. PATENT DOCUMENTS 5,614,026 A 3/1997 Williams
6,148,761 A * 11/2000 Majewski ......... C23C 16/45565
118/715

6,387,207 B1 5/2002 Janakiraman et al.
6,782,843 B2 8/2004 Kinnard et al.
7,296,534 B2 11/2007 Fink
8,083,853 B2 * 12/2011 Choi et al. ................... 118/715
8,328,939 B2 * 12/2012 Choi et al. ................... 118/715
8,419,959 B2 * 4/2013 Bettencourt et al. ........... 216/67
8,869,742 B2 * 10/2014 Dhindsa et al. .......... 118/723 E (Continued)

FOREIGN PATENT DOCUMENTS

CN 1574229 A 2/2005
CN 101423936 A 5/2009

(Continued)

OTHER PUBLICATIONS

U.S. Appl. No. 13/842,054, filed Mar. 15, 2013, entitled "Radical Source Design for Remote Plasma Atomic Layer Deposition."

(Continued)

*Primary Examiner* — Len Tran
*Assistant Examiner* — Adam J Rogers
(74) *Attorney, Agent, or Firm* — Weaver Austin Villeneuve & Sampson LLP

(57) ABSTRACT

A dual-plenum showerhead for semiconductor processing operations is provided. The showerhead may include a faceplate with two sets of gas distribution holes, each set fed by a separate plenum. One set of gas distribution holes may be through-holes in the faceplate of the showerhead and may allow gases trapped between the faceplate and a plasma dome to flow towards a wafer. The other set of gas distribution holes may distribute gas routed through passages or channels in the faceplate towards the wafer. The passages or channels in the faceplate may include radial channels and annular channels and may be fed from an annular gas distribution channel about the periphery of the faceplate.

19 Claims, 17 Drawing Sheets

(56) References Cited

U.S. PATENT DOCUMENTS

| | | |
|---|---|---|
| 2005/0000430 A1 | 1/2005 | Jang et al. |
| 2005/0241767 A1 | 11/2005 | Ferris et al. |
| 2006/0021703 A1 | 2/2006 | Umotoy et al. |
| 2006/0228496 A1* | 10/2006 | Choi et al. ............... 427/569 |
| 2006/0263522 A1 | 11/2006 | Byun |
| 2007/0068798 A1 | 3/2007 | Honda et al. |
| 2007/0110918 A1 | 5/2007 | Yuda et al. |
| 2007/0215048 A1 | 9/2007 | Suzuki et al. |
| 2008/0020146 A1* | 1/2008 | Choi ............... C23C 16/345 427/446 |
| 2008/0156631 A1 | 7/2008 | Fair et al. |
| 2009/0095621 A1 | 4/2009 | Kao et al. |
| 2009/0098276 A1 | 4/2009 | Burrows et al. |
| 2009/0236313 A1 | 9/2009 | Qiu et al. |
| 2009/0266911 A1 | 10/2009 | Kim et al. |
| 2009/0320756 A1 | 12/2009 | Tanaka |
| 2010/0003406 A1 | 1/2010 | Lam et al. |
| 2010/0184298 A1 | 7/2010 | Dhindsa |
| 2012/0135609 A1 | 5/2012 | Yudovsky et al. |
| 2012/0161405 A1 | 6/2012 | Mohn et al. |
| 2013/0341433 A1 | 12/2013 | Roy et al. |
| 2014/0179114 A1 | 6/2014 | van Schravendijk |
| 2014/0235069 A1 | 8/2014 | Breiling et al. |
| 2015/0007770 A1 | 1/2015 | Chandrasekharan et al. |

FOREIGN PATENT DOCUMENTS

| | | |
|---|---|---|
| CN | 101423937 A | 5/2009 |
| CN | 102424956 A | 4/2012 |
| WO | WO 2011/044451 A2 | 4/2011 |
| WO | WO 2012/122054 A2 | 9/2012 |

OTHER PUBLICATIONS

U.S. Appl. No. 13/934,620, filed Jul. 3, 2013, entitled "Multi-Plenum Showerhead With Temperature Control."

U.S. Appl. No. 13/934,597, filed Jul. 3, 2013, entitled "Multi-Plenum, Dual-Temperature Showerhead."

US Office Action dated Dec. 3, 2015 issued in U.S. Appl. No. 13/842,054.

Singapore Search Report and Written Opinion dated Jul. 7, 2015 issued in SG Patent Application No. 201401171-2.

US Office Action dated Apr. 7, 2016 issued in U.S. Appl. No. 13/934,597.

Chinese Office Action dated Dec. 9, 2015 issued in Application No. CN 201410052998.X.

Singapore Final Examination Report dated Jan. 12, 2016 issued in Application No. SG 201401171-2.

Chinese First Office Action dated Mar. 2, 2016 issued in Application No. CN 201410312720.1.

* cited by examiner

DUAL PLENUM, AXI-SYMMETRIC SHOWERHEAD WITH EDGE-TO-CENTER GAS DELIVERY

BACKGROUND OF THE INVENTION

Semiconductor processing tools often use components called "showerheads" to distribute process gas across a semiconductor substrate during processing. Such showerheads may include a faceplate that faces the substrate during processing, and a number of gas distribution holes may be distributed across the faceplate to facilitate gas delivery to the substrate from within the showerhead.

SUMMARY OF THE INVENTION

In some implementations, a faceplate for use in semiconductor processing showerhead is provided. The faceplate may include a volume with an outer surface, a top surface, a bottom surface, and a center axis. The top surface and the bottom surface may partially bound the volume, may be substantially parallel to, and offset from, each other, and may be substantially centered on, and normal to, the center axis. The outer surface may at least partially bound the volume in a radial direction with respect to the center axis. The faceplate may also include a plurality of first channels within the volume extending from the outer surface towards the center axis and a plurality of first gas distribution holes, each first gas distribution hole fluidly connected within the volume to one or more of the first channels and extending through the bottom surface and not extending through the top surface. The faceplate may also include a plurality of second gas distribution holes, each second gas distribution hole extending through the top surface and the bottom surface and not fluidly connected within the volume to the first channels.

In some implementations, the faceplate may further include a plurality of second channels within the volume. Each second channel may travel in a substantially circumferential direction with respect to the center axis and may be fluidly connected within the volume to at least one first channel. In some such implementations, the second channels may be concentric annular channels centered on the center axis. The radial spacing between each set of neighboring second channels may also be substantially the same.

In some implementations, two or more of the first channels may extend into the volume towards the center axis by different amounts. In some implementations, the first channels extend into the volume towards the center axis along substantially radial paths.

In some faceplate implementations, each second gas distribution hole may be chamfered where the second gas distribution hole intersects the top surface and where the second gas distribution hole intersects the bottom surface.

In some implementations, the first channels may have a first average transverse cross-sectional area along their length, the second channels may have a second average transverse cross-sectional area along their length, and the first average transverse cross-sectional area may be substantially larger than the second average transverse cross-sectional area. In some such implementations, the first average transverse cross-sectional area may be at least 80% larger than the second average transverse cross-sectional area.

In some implementations, the faceplate may include one or more gas distribution channels proximate to the outer surface, each gas distribution channel configured to be fluidly connected with one or more gas feed inlets. In some further implementations, each of the first channels may be fluidly connected with one of the one or more gas distribution channels through a transition region of the first channel. In some such implementations, the transverse cross-sectional area of the transition region of each first channel may be substantially less than the average transverse cross-sectional area of the first channel. In some faceplate implementations, the transverse cross-sectional area of each transition region may be less than 15% of the transverse cross-sectional area of the first channel for the transition region.

In some implementations, the faceplate may include 24 first channels and the first channels may be arranged in a radial pattern about the center axis with substantially equal spacing.

In some implementations, the plurality of first gas distribution holes and the plurality of the second gas distribution holes may be distributed across a substantially circular region of the bottom surface, the substantially circular region having a nominal radius R. The first channels in a first subgroup of the first channels terminate at distances between 0% and 20% of R from the center axis, the first channels in a second subgroup of the first channels terminate at distances between 15% and 35% of R from the center axis, and the first channels in a third subgroup of the first channels terminate at distances between 30% and 50% of R from the center axis. The first channels in the first subgroup may be arranged in a radial pattern about the center axis with substantially equal spacing, the first channels in the second subgroup may be arranged in a radial pattern about the center axis with substantially equal spacing, and the first channels in the third subgroup may be arranged in a radial pattern about the center axis with substantially equal spacing.

In some implementations, the transverse cross-sectional area of each transition region may be less than 10% of the transverse cross-sectional area of the gas distribution channel with which the transition region is fluidly connected multiplied by the number of the first channels fluidly connected with that gas distribution channel divided by the number of the gas feed inlets fluidly connected with that gas distribution channel.

In some faceplate implementations, the first gas distribution holes may be distributed in a pattern with substantially uniform density across the bottom surface, and the second gas distribution holes may be distributed in a pattern with substantially uniform density across the bottom surface.

In some implementations, the faceplate is formed by a first component, the first component including the top surface and a component bottom surface opposite the top surface, and a second component, the second component including the bottom surface and a component top surface opposite the bottom surface. The component bottom surface and the component top surface may be mated together, the first channels may be formed by features in the component top surface, features in the component bottom surface, or features in both the component top surface and the component bottom surface, and the first gas distribution holes may be formed in the second component and extend through the component top surface.

In some implementations, the first component and the second component may include features facilitating the use of threaded fasteners to clamp the first component to the second component in order to mate the component bottom surface and the component top surface. In some other implementations, the component bottom surface and the component top surface may be bonded together.

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale unless specifically indicated as being scaled drawings.

BRIEF DESCRIPTION OF THE DRAWINGS

FIGS. 1 through 5 and 12 through 21 are scaled drawings, although the drawing scale may vary from Figure to Figure (the proportions within each Figure are still to-scale, however).

DETAILED DESCRIPTION

Examples of various implementations are illustrated in the accompanying drawings and described further below. It will be understood that the discussion herein is not intended to limit the claims to the specific implementations described. On the contrary, it is intended to cover alternatives, modifications, and equivalents as may be included within the spirit and scope of the invention as defined by the appended claims. In the following description, numerous implementation-specific details are set forth in order to provide a thorough understanding of the present invention. The present invention may be practiced without some or all of these implementation-specific details. In other instances, well-known process operations have not been described in detail in order not to unnecessarily obscure the present invention.

Figure 1:
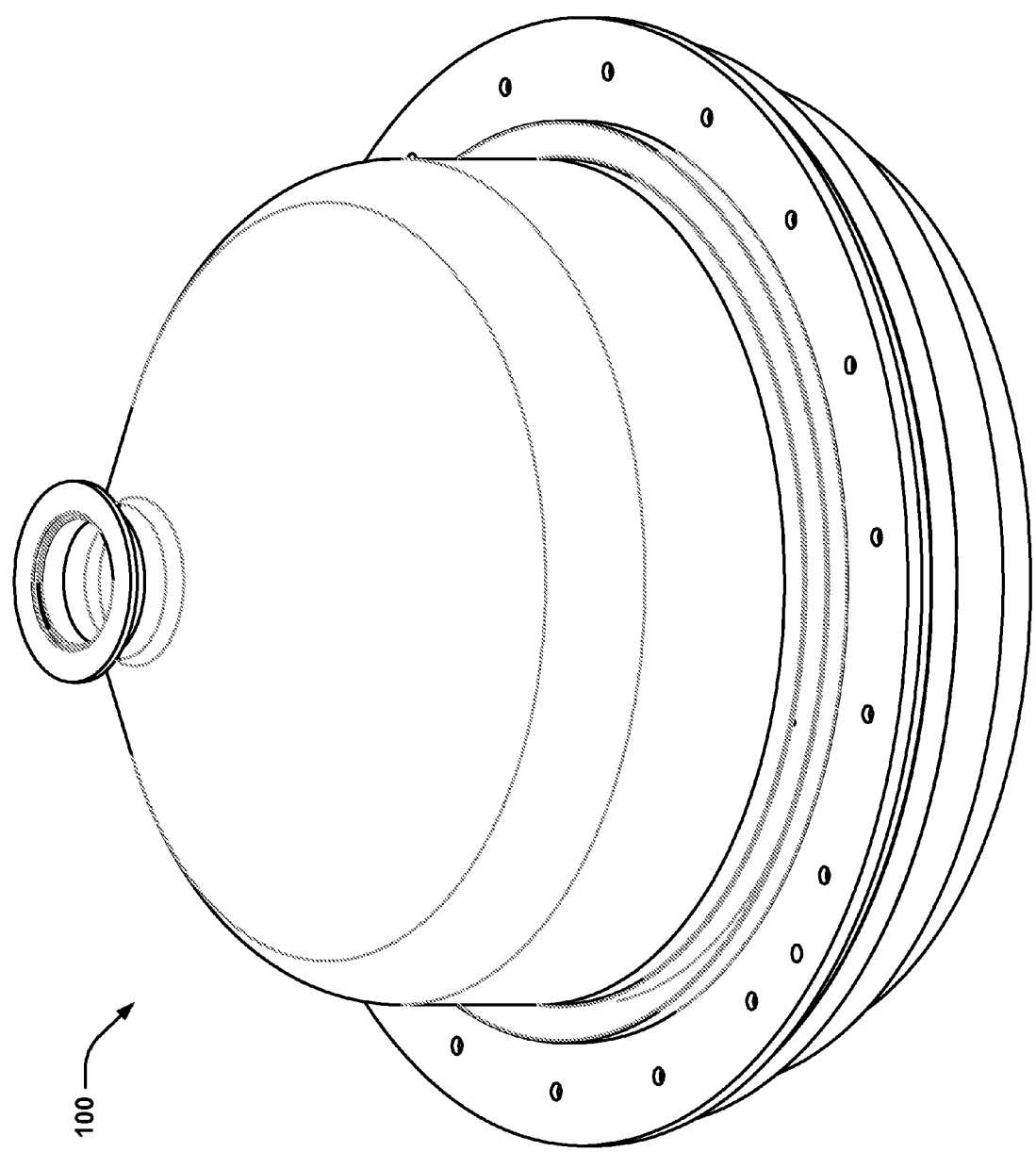
FIG. 1 depicts an isometric view of an example of a dual-plenum showerhead and a wafer support.

FIG. 1 depicts an isometric view of an example of a dual-plenum showerhead and a wafer support. While only some of the exterior details of a dual-plenum showerhead 100 are visible, later figures reveal further detail.

Figure 2:
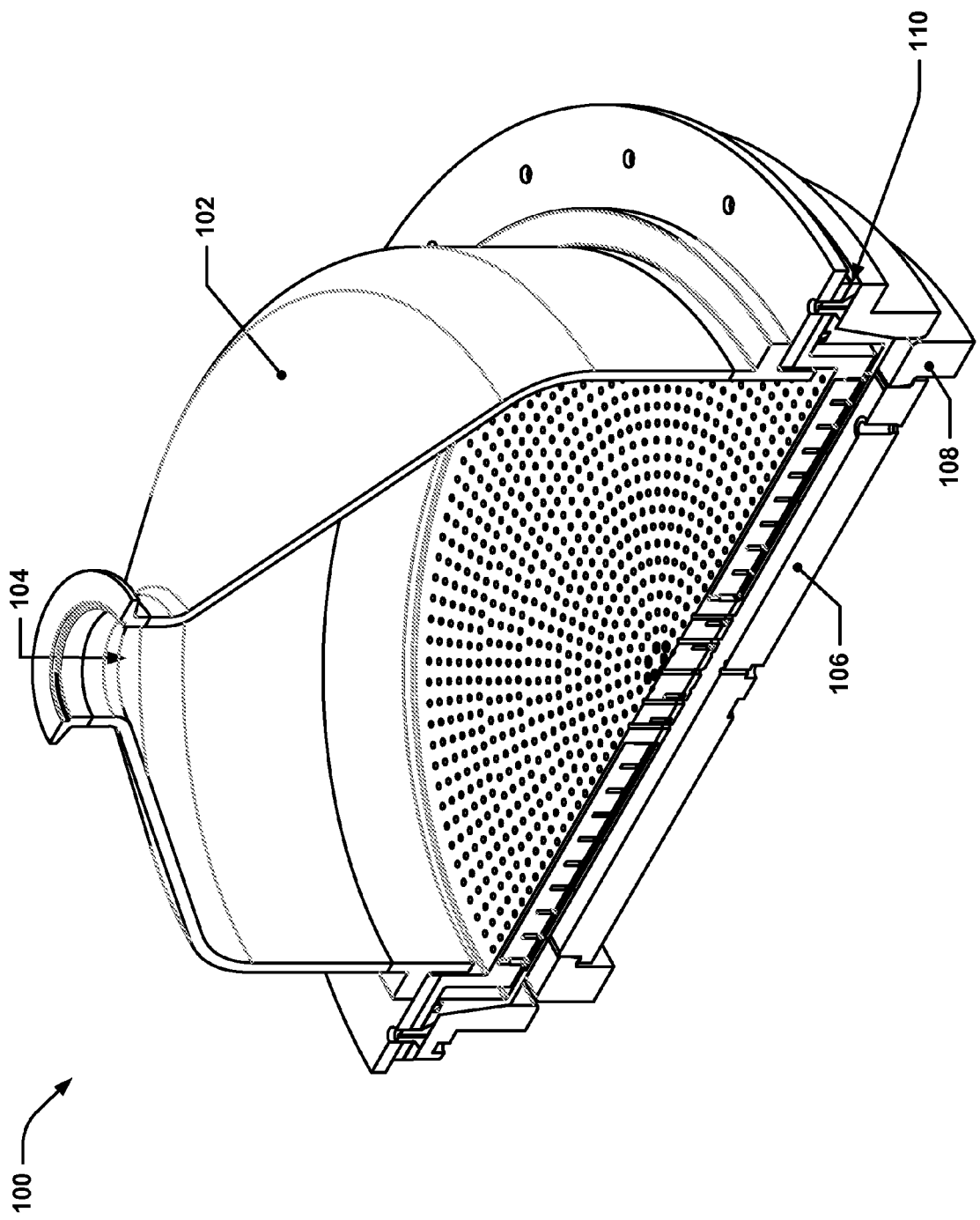
FIG. 2 depicts an isometric section view of the example dual-plenum showerhead and wafer support of FIG. 1.

FIG. 2 depicts an isometric section view of the example dual-plenum showerhead and wafer support of FIG. 1. As can be seen, a plasma dome 102 is mounted to a faceplate 110. The plasma dome 102 and the faceplate 110 may define a first plenum volume in which a plasma may be sparked. The plasma dome 102 may have a remote plasma source mounting location 104 in the top to allow a plasma generator (not shown) to be mounted. Plasmas may be sparked using gases introduced into the first plenum volume via one or more inlets (not shown, but may, for example, be routed through the remote plasma source mounting location 104. Also visible in FIG. 2 is a wafer support 106 and a guard ring 108; these are not components of the showerhead 100, but are depicted to give additional context for how the showerhead 100 may be positioned with regard to a wafer (or wafer support) in a semiconductor processing tool.

Figure 3:
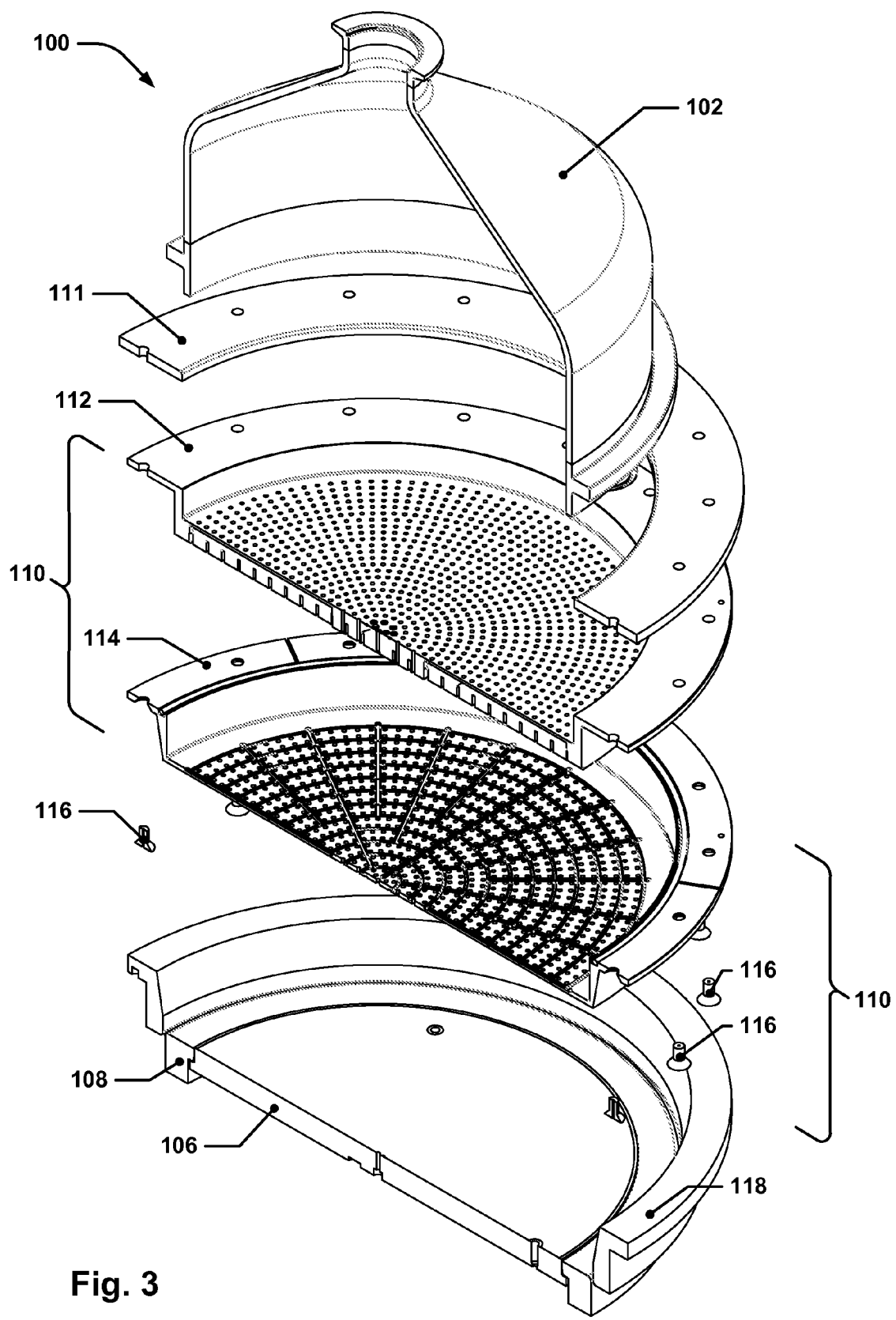
FIG. 3 depicts an exploded, isometric section view of the example dual-plenum showerhead and wafer support of FIG. 1.

FIG. 3 depicts an exploded, isometric section view of the example dual-plenum showerhead and wafer support of FIG. 1. The remote plasma dome 102 may be seen, as may the faceplate 110. In this example, the faceplate 110 is fashioned from an upper faceplate half 112 and a lower faceplate half 114 (it is to be understood that the term "half" in this particular context may not actually indicate a 50/50 relationship between the two components, but is used in the more general sense to indicate two components that may be combined to form a larger component—other implementations may feature a unitary design or may use more than two components to form the faceplate 110). A series of screws 116 may be used to clamp the upper faceplate half 112 and the lower faceplate half 114 together. The screws 116 may thread into an interface plate 111 that may mate with a flange on the upper faceplate half 112. The faceplate 110 may be seated in a mounting ring 118. Finally, the wafer support 106 and the guard ring 108 are also visible. The mounting ring 118 may have a slightly larger diameter than the diameter of the guard ring 108 to allow the mounting ring 118 to be slid down and around the guard ring 108 or vice versa.

Faceplate 110, plasma dome 102, and the other major components shown in FIG. 3 may be made from aluminum, ceramic materials, or other materials compatible with a semiconductor processing environment. While the upper faceplate half 112 and the lower faceplate half 114 shown are bolted together in this implementation, other methods of forming the faceplate 110 may be used instead. For example, the upper faceplate half 112 and the lower faceplate half 114 may be bonded together, for example, with a diffusion bond or with a braze.

Figure 4:
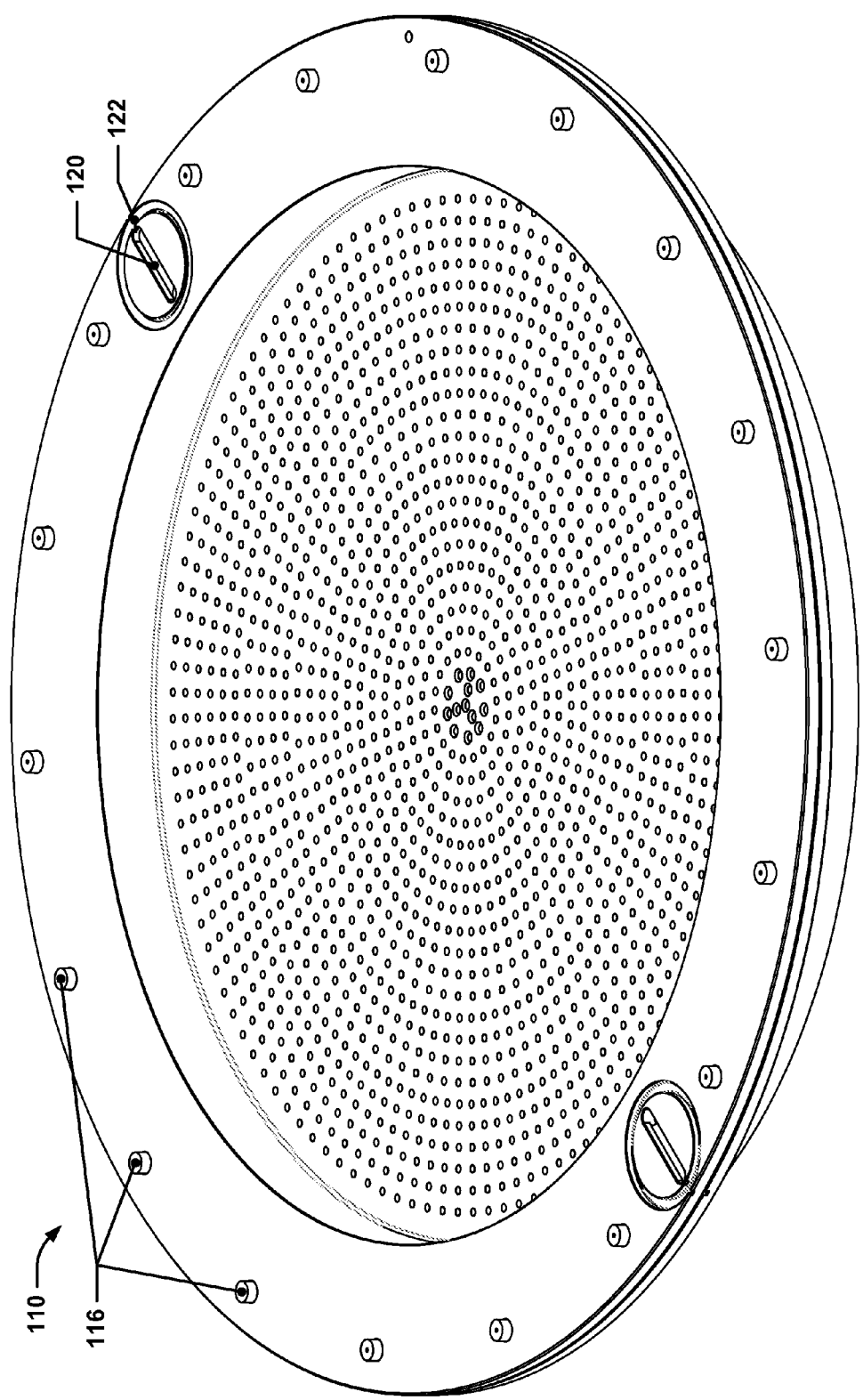
FIG. 4 depicts an isometric view of the faceplate of the example dual-plenum showerhead of FIG. 2.

FIG. 4 depicts an isometric view of the faceplate of the example dual-plenum showerhead of FIG. 2. One or more gas feed inlets 120 may be spaced about the periphery of the faceplate 110. In this particular example, two gas feed inlets 120 are featured and are placed on opposite sides of the faceplate 110. Each gas feed inlet 120, in this case, features a corresponding gas feed inlet o-ring 122 to provide a hermetic interface between the gas feed inlet 120 and a mating component, such as interface plate 111. Each gas feed inlet 120 may be in fluidic communication with a gas distribution channel within the faceplate 110.

Figure 5:
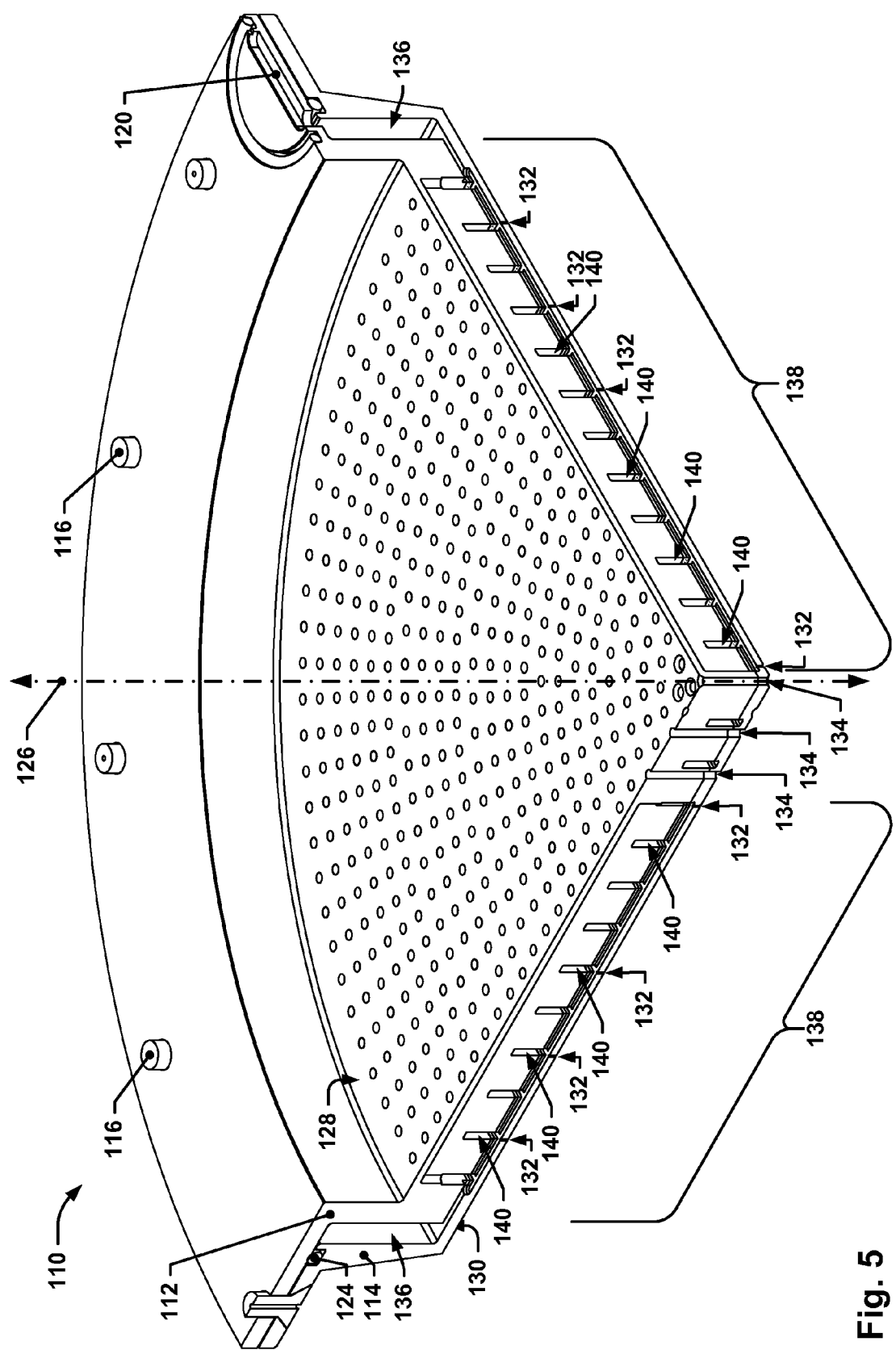
FIG. 5 depicts an isometric, quarter-section view of the faceplate of FIG. 4.
Figure 6:
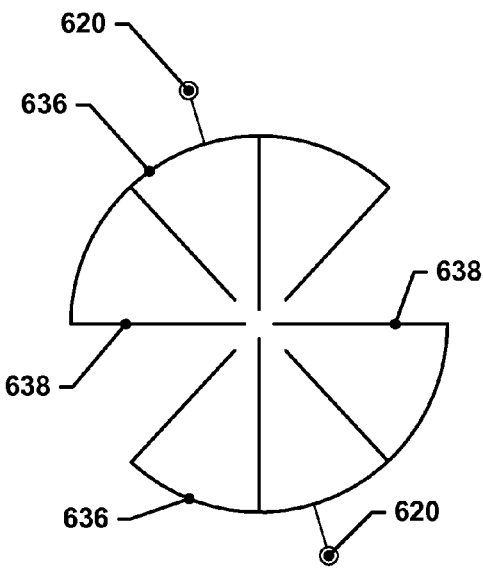
FIG. 6 depicts a conceptual diagram of an example split gas distribution channel.

FIG. 5 depicts an isometric, quarter-section view of the faceplate of FIG. 4. Also included in FIG. 4 is center axis 126, which is used to demark the nominal center of the faceplate 110. As can be seen, the bottom surface of the upper faceplate half 112 rests on the top surface of the lower faceplate half 114. However, a radial gap exists between the upper faceplate half 112 and the lower faceplate half 114 that forms a gas distribution channel 136. In this example, the gas distribution channel 136 is annular and extends around the entire faceplate 110. In the implementation shown, the gas distribution channel 136 may have an inner diameter of approximately 13" and an outer diameter of approximately 13.5". The gas feed inlets 120 may be in fluidic communication with the gas distribution channel 136. A faceplate o-ring 124 may prevent gas from the gas feed inlets 120 and the gas distribution channel 136 from escaping through the interface between the upper faceplate half 112 and the lower faceplate half 114. Other implementations may feature several gas distribution channels. For example, one alternative implementation for a two-gas feed inlet design may be to utilize two opposing, annular gas distribution channels that each only extend through 175 degrees of arc, i.e., each gas feed inlet feeds a separate gas distribution channel. FIG. 6, for example, depicts a conceptual diagram of an implementation with two gas distribution channels 636 that each extend only partially about the circumference of a faceplate (not shown). A radial array of first channels 638 extend from the gas distribution channels 636 towards the center of the faceplate. A gas feed inlet 620 connects with each of the gas distribution channels 636. Second channels are not shown in FIG. 6.

Also visible in FIG. 5 are two first channels 138. The first channels 138 may be formed within the faceplate 110 and may extend in a substantially radial direction, e.g., like spokes on a wheel, with respect to the center axis 126. Other implementations may feature other channel path shapes, such as non-radial spoke channels or curving or pinwheel channels—such designs may, however, share the common trait of having first channels 138 that generally extend towards the center axis 126 of the faceplate 110 from locations spaced about the periphery of the faceplate 110.

Figure 7:
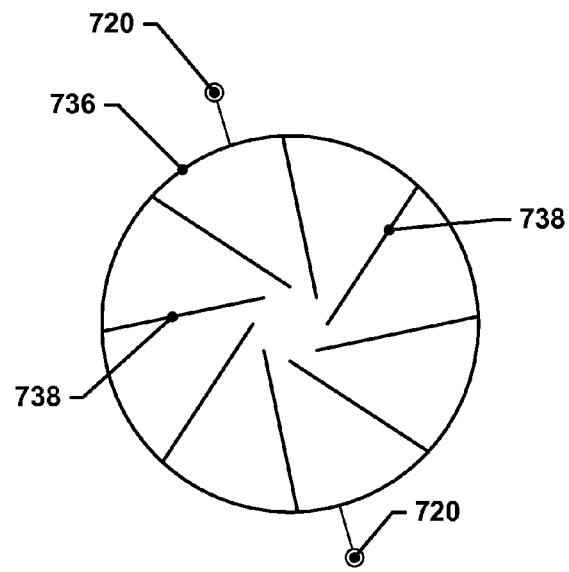
FIG. 7 depicts a conceptual diagram of an example sloped-spoke first channel arrangement.

FIG. 7, for example, depicts a conceptual diagram of an implementation with first channels 738 that extend from an annular gas distribution channel 736 towards the center of the faceplate in a general manner, but with a slight angular offset from radii that actually intersect the center of the faceplate. Two gas feed inlets 720 connect with the gas distribution channel 736. Second channels are not shown in FIG. 7.

Figure 8:
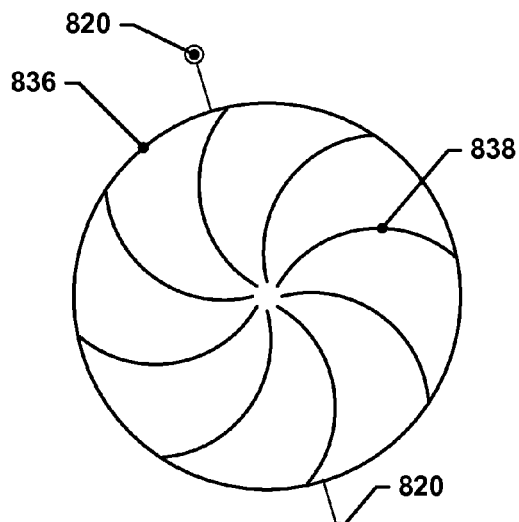
FIG. 8 depicts a conceptual diagram of an example pinwheel-spoke first channel arrangement.

FIG. 8, for example, depicts a conceptual diagram of an implementation with pinwheel-spoke first channels 838 that extend from an annular gas distribution channel 836 towards the center of the faceplate in a general manner, but along curving paths (giving rise to a "pinwheel" appearance). Two gas feed inlets 820 connect with the gas distribution channel 836. Second channels are not shown in FIG. 8.

Also visible in FIG. 5 are twelve second channels 140 (not all are enumerated) that may be formed within the faceplate 110 and that may extend in a substantially circumferential direction with respect to the center axis 126. The second channels 140 may have different nominal diameters and be spaced apart such that they are distributed across the faceplate 110. While the second channels 140 that are shown are concentric annular channels that extend through 360 degrees, other implementations may feature other channel path shapes. For example, instead of multiple annular second channels 140, one or multiple spiral second channels centered on the center axis 126 may be used in some implementations. Alternatively, the second channels may not extend in a full circle about the center axis 126—for example, four separate second channels with the same nominal channel path radius may each extend through 85 degrees and may be arranged in an evenly-spaced radial pattern. This may allow gas routed through the second channels to be routed around substantially an entire 360 degree sweep while keeping each segment of the second channels locally isolated from the other segments at the same radial position.

Figure 9:
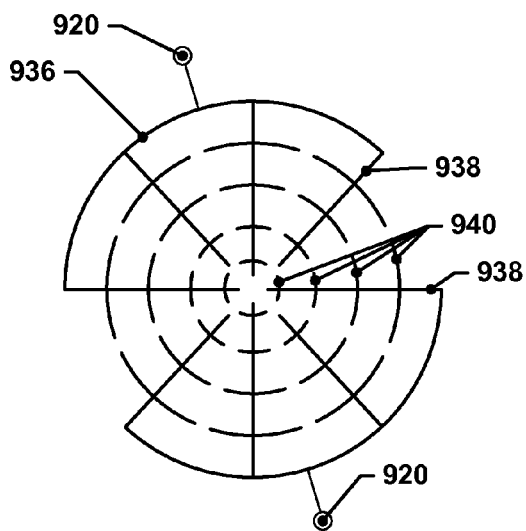
FIG. 9 depicts a conceptual diagram of an example split second channel arrangement.

FIG. 9, for example, depicts a conceptual diagram of an implementation with radial spoke first channels 938 that extend from split annular gas distribution channels 936 towards the center of the faceplate. A gas feed inlet 920 connects with each of the gas distribution channels 936. This arrangement is similar to that shown in FIG. 6. FIG. 9, however, also shows second channels 940. The second channels 940 are broken up into multiple, short channels such that gas fed into each first channel 938 does not encounter gas fed into the other first channels 938 within the faceplate plenum volume.

The faceplate 110 is part of a "dual-plenum" showerhead. The faceplate 110 may feature two different sets of gas distribution holes, each serving to exhaust a different plenum volume. For example, the faceplate 110 may include first gas distribution holes 132 and second gas distribution holes 134. As noted previously, the first plenum volume may be formed between the remote plasma dome 102 (not shown in FIG. 5) and the faceplate 110. Thus, the second gas distribution holes 134 may allow gas within the first plenum volume to escape towards a wafer being processed using the faceplate 110. The second plenum volume may be formed, at least in part, by the volume defined by the first channels and the second channels. The first gas distribution holes 132 may allow gas within the second plenum volume to escape towards a wafer being processed using the faceplate 110.

In the implementation shown, the first gas distribution holes 132 may be substantially smaller than the second gas distribution holes 134. For example, the first gas distribution holes 132 may be approximately 0.02" in diameter while the second gas distribution holes 134 may be approximately 0.09" in diameter. The second gas distribution holes may also extend completely through the faceplate 110, i.e., from top surface 128 to bottom surface 130. In the implementation shown, the top surface 128 and the bottom surface 130 may be offset from one another by a distance of approximately 0.725". In some implementations, since a remote plasma may be generated in the first plenum volume, it may be desirable to increase the number of free radicals that are released towards the wafer being processed using the faceplate 110. The second gas distribution holes 134 may thus have a diameter that, within certain constraints, is configured to maximize, to the extent possible, the number of free radicals that pass through the faceplate 110. Some of the constraints that may further govern the diameter of the second gas distribution holes 134 may include, for example, that the second gas distribution holes 134 may all have substantially the same nominal diameter, that the second gas distribution holes 134 maintain a standoff distance from any of the first or second channels to avoid potential channel wall breaches, and that the second gas distribution holes 134 be distributed in a relatively uniform manner across the region of the bottom surface 130 that they occupy, e.g., in the implementation shown, the first gas distribution holes 132 and the second gas distribution holes 134 may be distributed across a circular region of approximately the same diameter as the outermost second channel 140. In some implementations, the density of first gas distribution holes may be different from the density of the second gas distribution holes. For example, in the faceplate 110 shown, there are approximately 600-650 first gas distribution holes and 1700-1800 second gas distribution holes. In the implementation shown, this circular region may be approximately 12" in diameter. Other factors may govern the size of the second gas distribution holes 134 as well, such as fluidic flow conditions. To further increase the number of free radicals that pass through the faceplate 110, the second gas distribution holes 134 may be chamfered or undergo a different edge treatment on one or both sides to increase the number of unobstructed lines-of-sight through the second gas distribution holes 134. To avoid undue visual clutter, only a few of the second gas distribution holes 134 shown in FIG. 5, i.e., second gas distribution holes 134 near the center axis 126, are shown with chamfered edges, although all of the second gas distribution holes 134 may be similarly chamfered.

Figure 10:
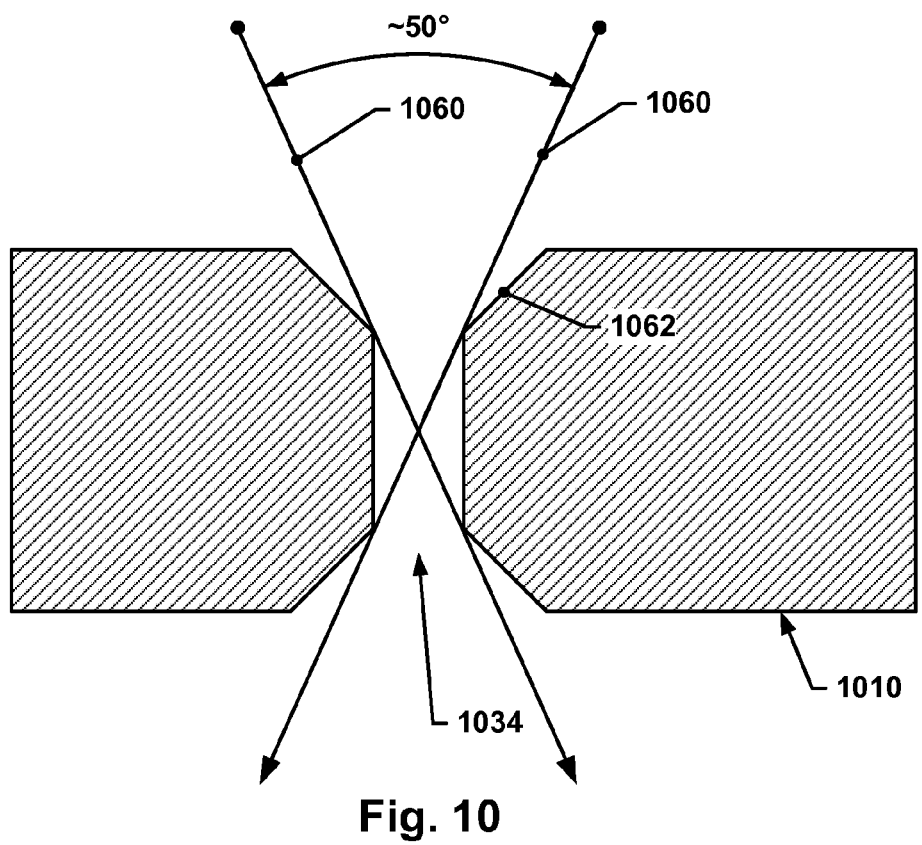
FIG. 10 depicts a cross-sectional view of an example second gas distribution hole with chamfers.
Figure 11:
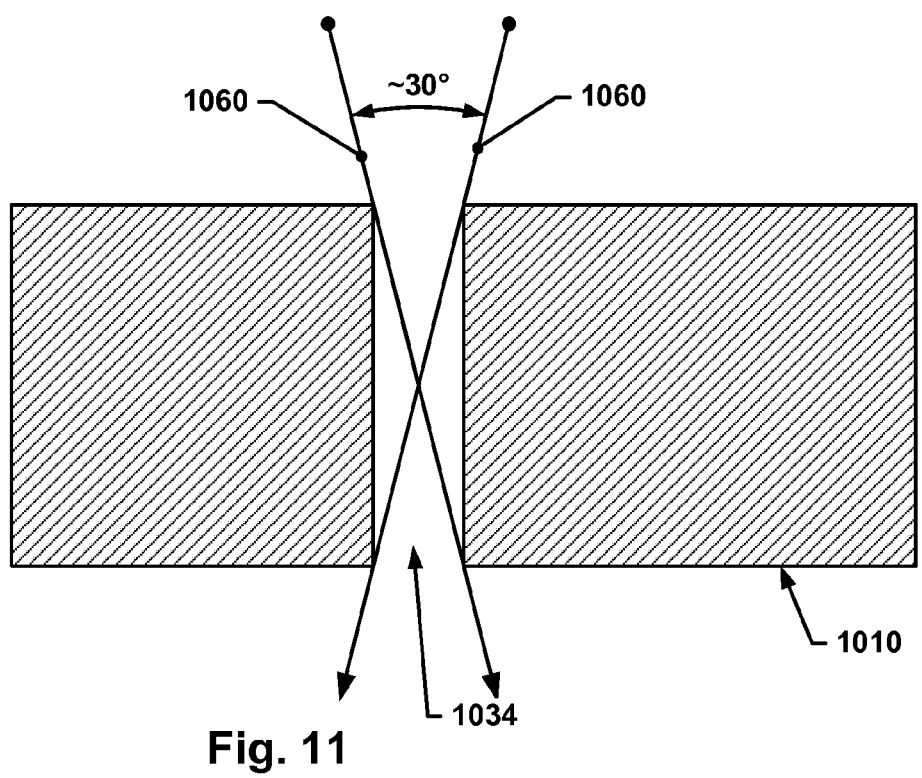
FIG. 11 depicts a cross-sectional view of an example second gas distribution hole without chamfers.

FIG. 10 depicts a cross-sectional view of an example second gas distribution hole with chamfers. FIG. 11 depicts a cross-sectional view of an example second gas distribution hole without chamfers. Aside from the presence or absence of the chamfers 1062, the configurations shown in FIGS. 10 and 11 are the same. As can be seen, the presence of chamfers 1062 in this example allows free radicals following free radical approach paths 1060 within 25 degrees of a center axis of a second gas distribution hole 1034 in a faceplate 1010 to pass through the second gas distribution hole 1034 unobstructed. In contrast, the absence of the chamfers 1062 allows only free radicals following the free radical approach paths 1060 within 15 degrees of the center axis of the second gas distribution hole 1034 in the faceplate 1010 to pass through the second gas distribution hole 1034 unobstructed.

Chamfers may also be used to shape gas flows. For example, the first gas distribution holes 132 may be chamfered where they intersect the bottom surface 130 in order to modify the gas flow upon exiting the first gas distribution holes 132. While some of the first gas distribution holes 132 shown in the Figures of this application may demonstrate such chamfering, other first gas distribution holes 132 may not to avoid undue visual clutter—however, all of the first gas distribution holes 132 may be chamfered in such a manner if desired.

Figure 12:
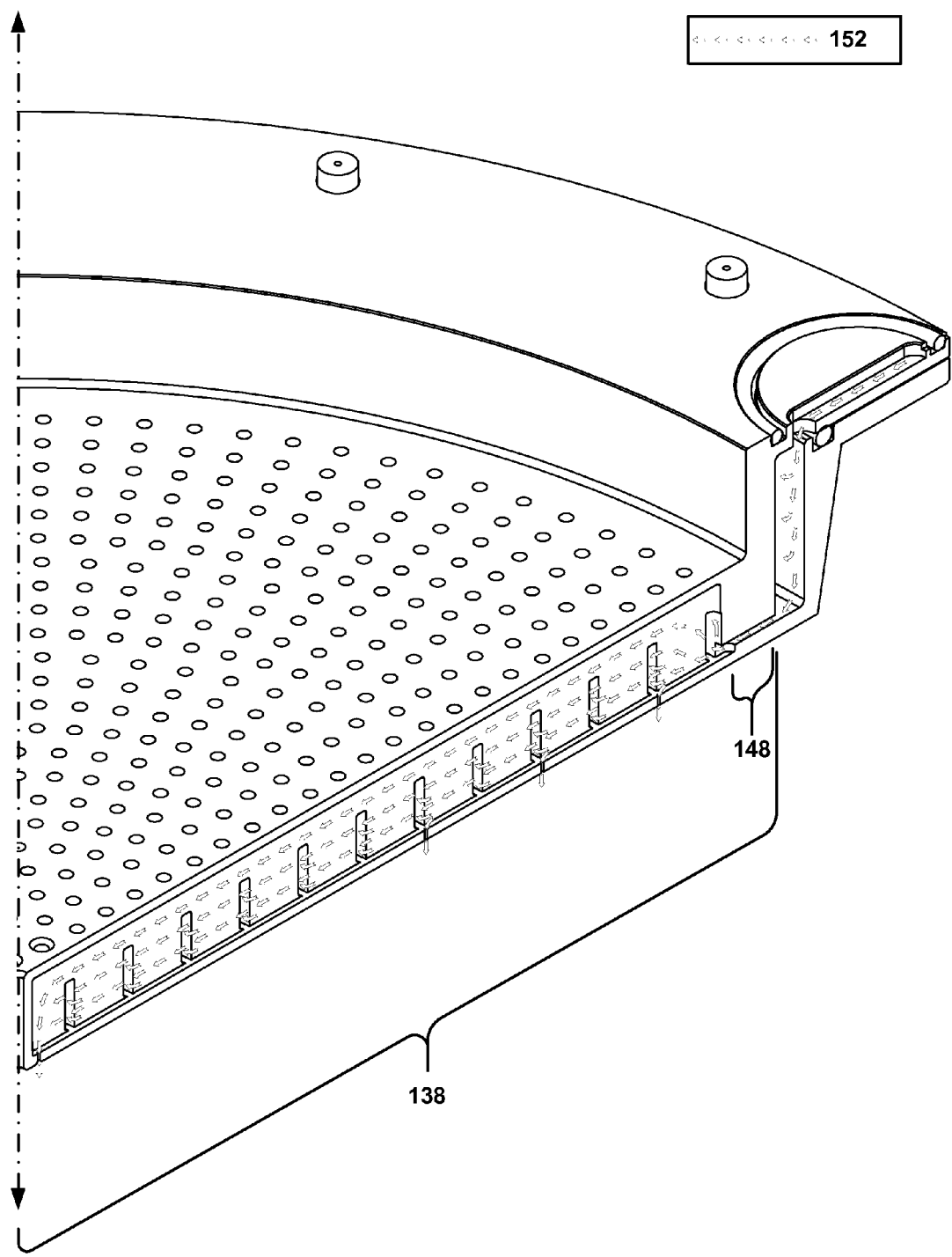
FIG. 12 depicts an isometric, eighth-section view of the faceplate of FIG. 5.

FIG. 12 depicts an isometric, eighth-section view of the faceplate of FIG. 5. The first channel 138 is called out, but the other features discussed with regard to previous figures are not separately indicated. Also shown are a number of gas flow paths, indicated by white gas flow arrows 152. As can be seen, the gas flow 152 begins at the gas feed inlet and then flow into the gas distribution channel 136 and into the first channels 138. Each first channel is fluidly connected with the gas distribution channel 136 via a transition region 148; the transition regions 148 may be regions of the first channels 138 that are substantially smaller in transverse cross-sectional area than the average cross-sectional areas of the first channels 138. As used herein with respect to channels, the term "transverse cross-sectional area" refers to the cross-sectional area of the channel in a plane substantially normal to the nominal direction of fluid flow in the channel. For example, for a straight, long channel, the transverse cross-sectional area would be evaluated with respect to a plane normal to the long axis of the channel. For an annular channel, the transverse cross-sectional area would be evaluated with respect to a plane substantially coincident with the centerline of the annular channel.

After passing through the transition region 148, the gas flow 152 expands into the larger volume of the first channel 138 and also travels down the second channels 140 that are in fluid communication with the first channel 138. Some of the gas flows out of the first gas distribution holes 132 towards the wafer being processed using the faceplate 110. At the same time, plasma gas/free radicals may be flowed through the second gas distribution holes 134 towards the wafer, although this gas flow is not shown to avoid undue clutter.

Figure 13:
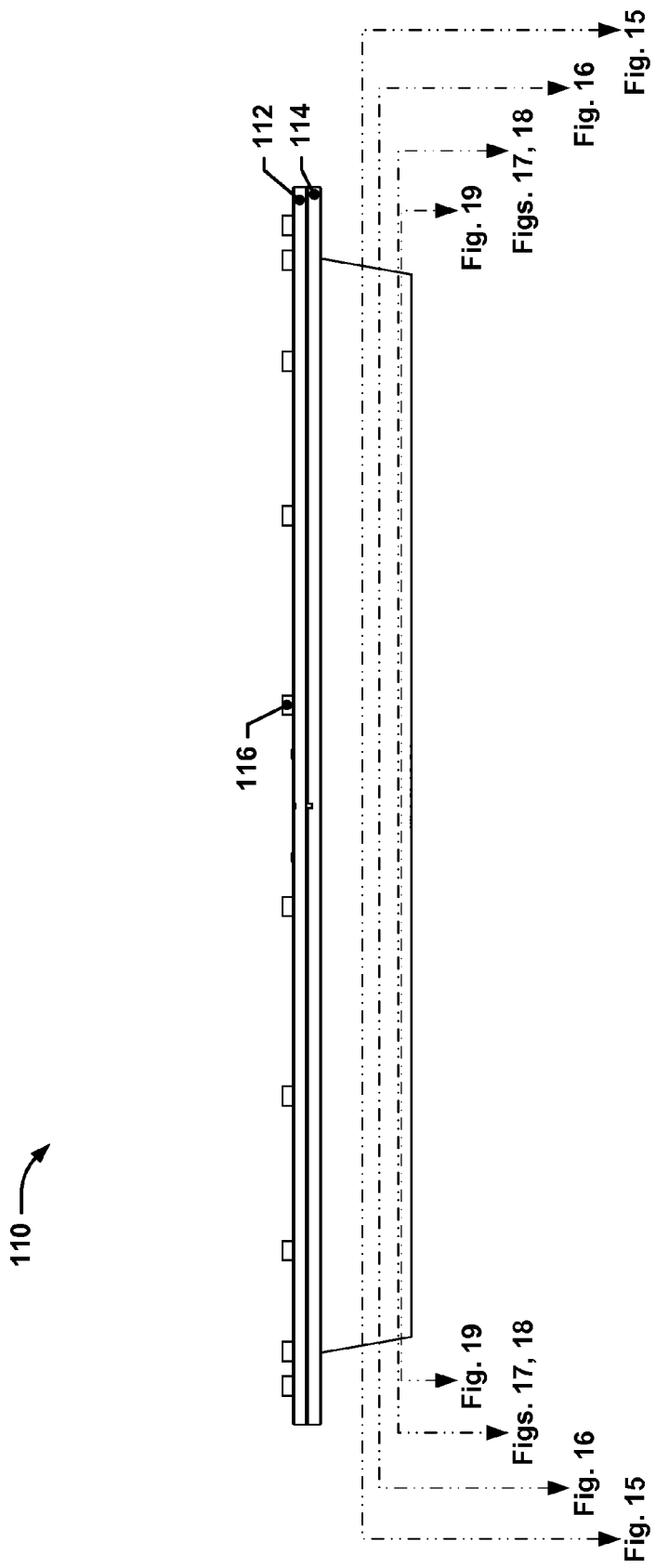
FIG. 13 depicts a side view of the faceplate of FIG. 4 with section lines describing section views in FIGS. 15-19.
Figure 14:
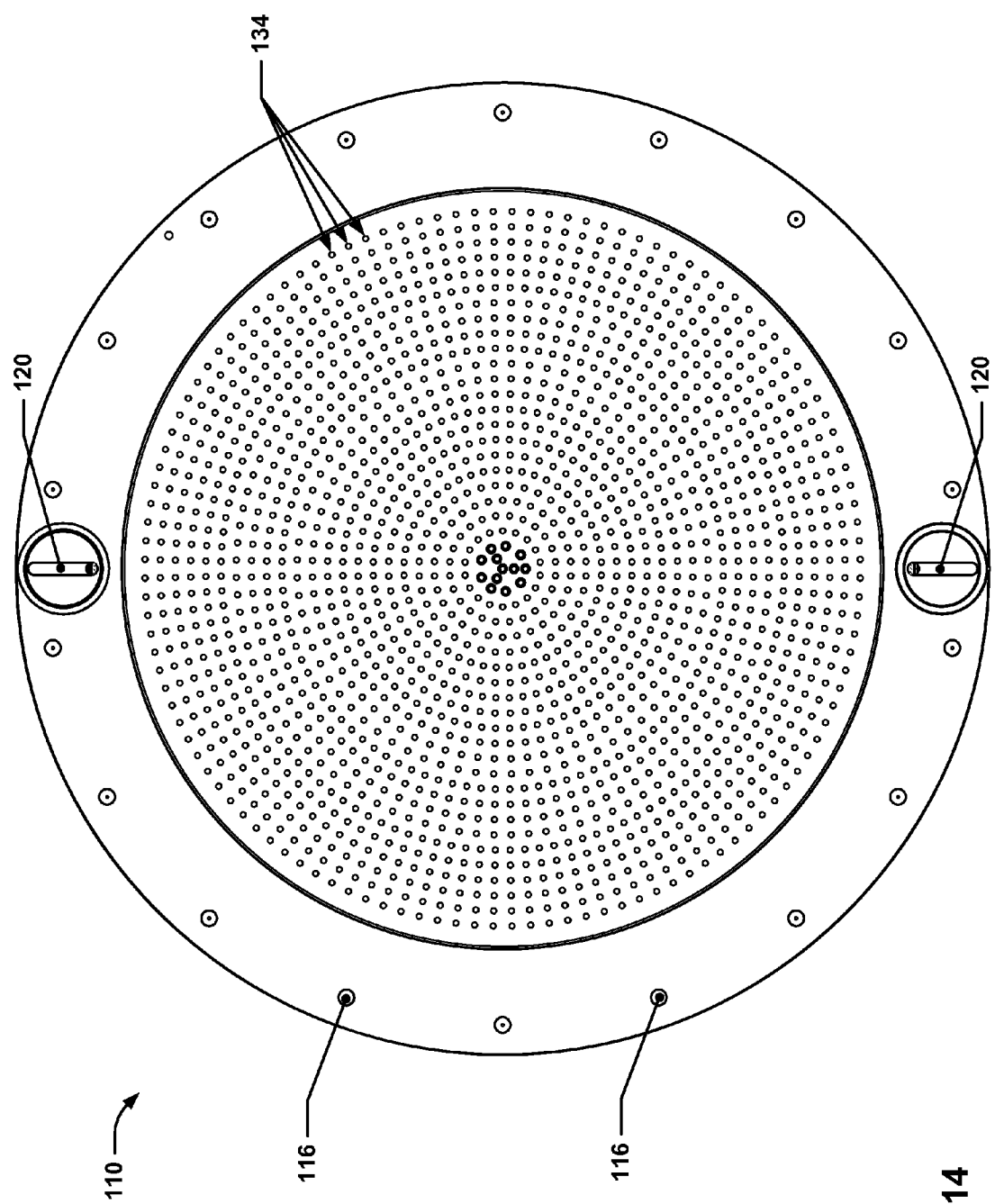
FIG. 14 depicts a plan view of the faceplate of FIG. 4.

FIG. 13 depicts a side view of the faceplate of FIG. 4 with section lines describing section views in FIGS. 15-19. Section lines indicate the approximate location of each section view shown in FIGS. 15-19. FIG. 14 depicts a plan view of the faceplate of FIG. 4.

Figure 15:
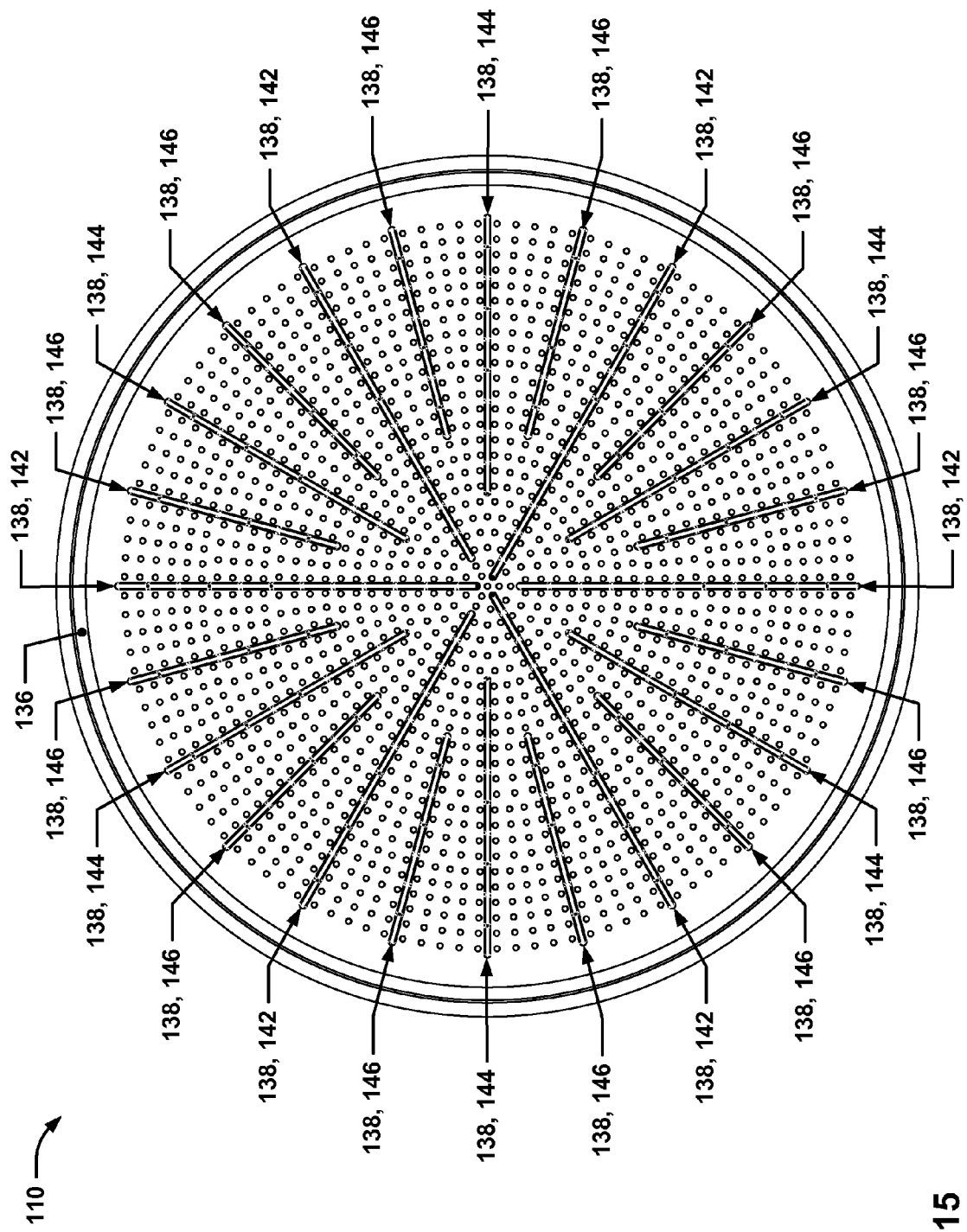
FIG. 15 depicts a removed section view of the faceplate of FIG. 4 at a first depth.
Figure 18:
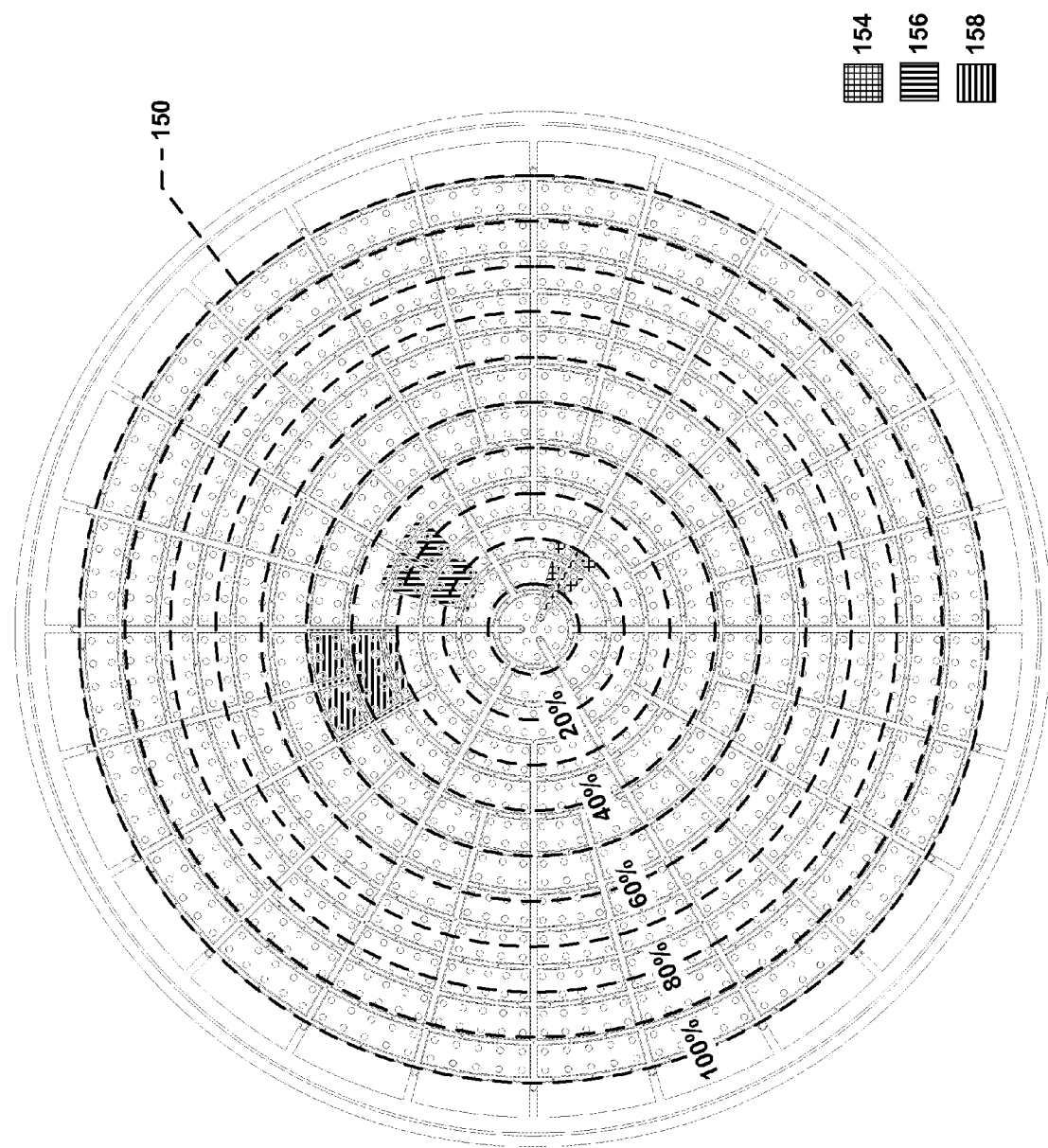
FIG. 18 depicts the removed section view of FIG. 17 with additional annotations and at a different scale.

FIG. 15 depicts a removed section view of the faceplate of FIG. 4 at a first depth. In this view, most of the first channels 138 may be seen. This is because, at least in this example, the first channels 138 are higher than the second channels, i.e., the second channels do not intersect the section plane used in FIG. 15. The first channels 138, as can be seen, extend towards the center of the faceplate 110 in a radial direction by varying amounts. Some portions of the first channels 138 may not be visible, e.g., the transition regions 148 joining the first channels 138 to the gas distribution channel 136 are not visible since they do not intersect the section plane used in FIG. 15. A total of 24 first channels 138 are used in this example, and may be divided up into multiple subgroups. For example, the first channels 138 may be divided up into 3 or 4 general subgroups. The first channels 138 in a first subgroup 142 may extend toward the center the furthest, e.g., to diametral locations within 20% of the diameter of the smallest circular region that includes all of the first gas distribution holes 132 and the second gas distribution holes 134. The first channels 138 in a second subgroup 144 may extend toward the center to diametral locations within 15 to 35% of the diameter of the smallest circular region that includes all of the first gas distribution holes 132 and the second gas distribution holes 134. The first channels 138 in a third subgroup 146 may extend toward the center to diametral locations within 30 to 50% of the diameter of the smallest circular region that includes all of the first gas distribution holes 132 and the second gas distribution holes 134. These regions are depicted in FIG. 18 (the smallest circular region that includes all of the first gas distribution holes 132 and the second gas distribution holes 134 is indicated by circle 150), e.g., a pie wedge 154 shows the 0 to 20% region for a first channel 138, an annular segment 156 shows the 15 to 35% region for another first channel 138, and another annular segment 158 shows the 30 to 50% region for yet another first channel 138 (FIG. 18 is at a different overall scale than the other cross-sectional views). There may be variation in the length of the first channels 138 within each subgroup as well. For example, the first channels 138 in the first subgroup 142 may be split into two further subgroups with slightly different first channel 138 lengths, as can be seen in FIG. 15. The first channels 138 may be arranged in a radial pattern with equal spacing, both in a global sense and within each subgroup. For the reader's reference, dashed circles in 10% increments are shown, although only every second such circle is labeled.

Figure 16:
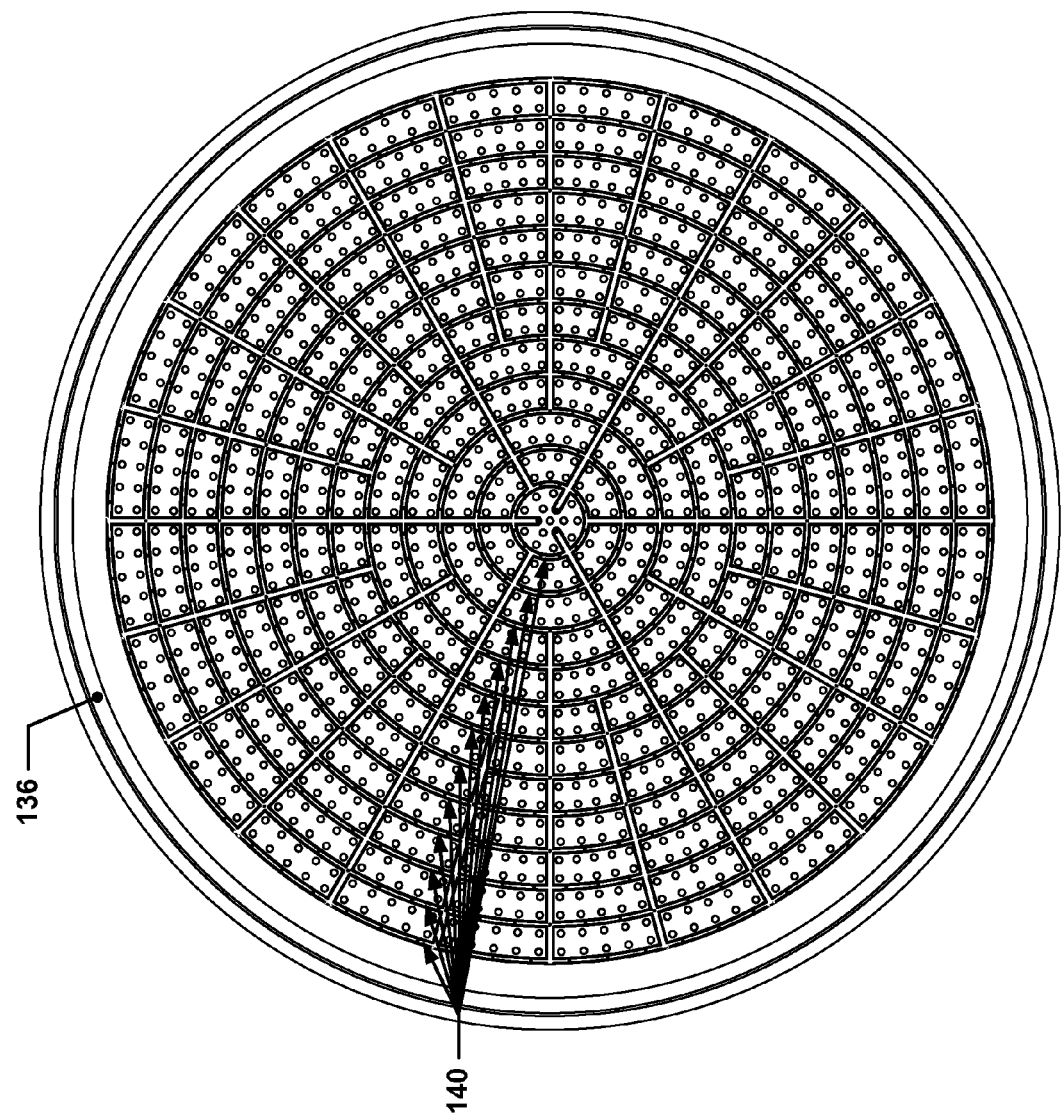
FIG. 16 depicts a removed section view of the faceplate of FIG. 4 at a second depth.

FIG. 16 depicts a removed section view of the faceplate of FIG. 4 at a second depth. In this view, the section plane depth is deep enough that the second channels 140 intersect the section plane. In this example implementation, twelve second channels 140 are shown. In some cases, the first channels 138 terminate when they intersect a second channel, e.g., the first channels 138 in the second subgroup 144 and the third subgroup 146. In other cases, the first channels 138 may terminate at a point beyond an intersection with a second channel 140, e.g., some of the first channels 138 may extend beyond the innermost second channel 140.

Figure 17:
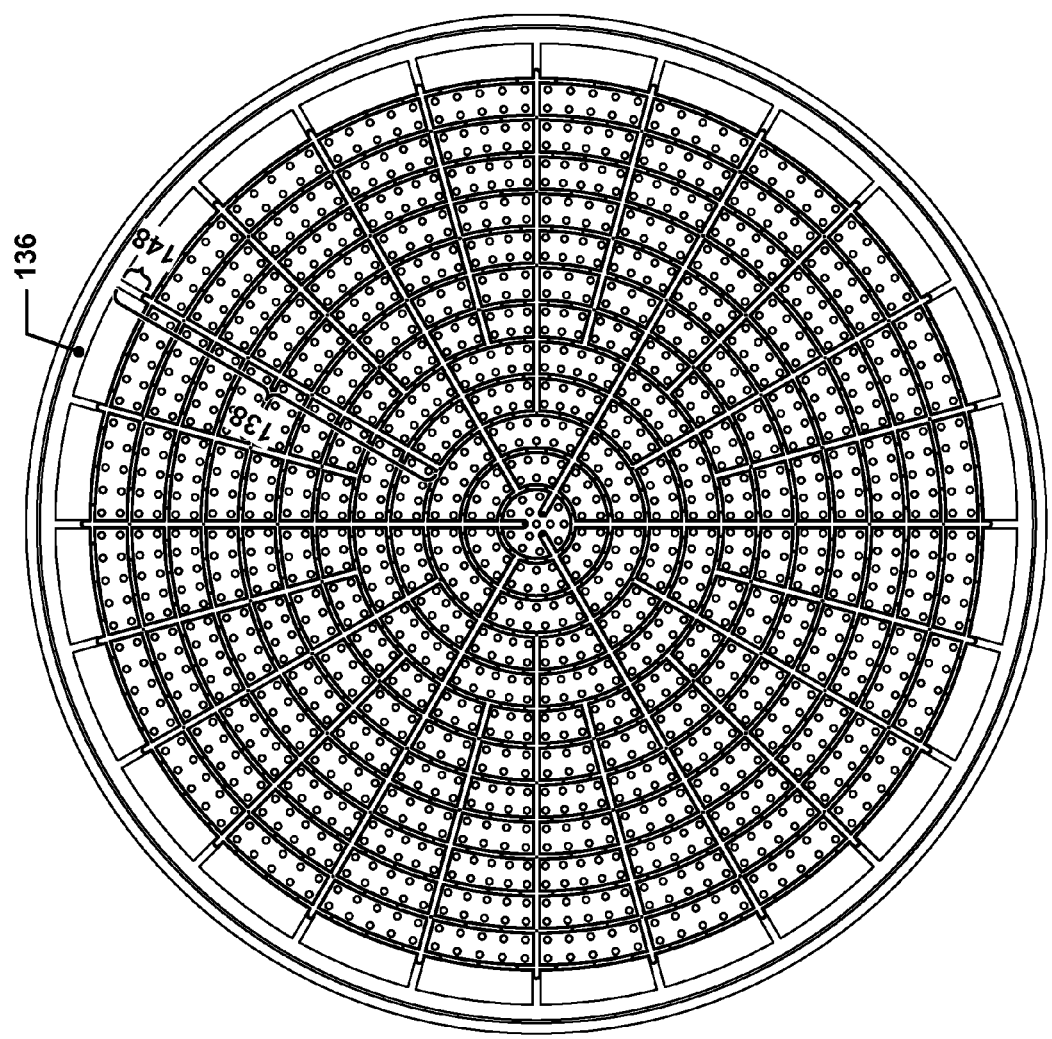
FIG. 17 depicts a removed section view of the faceplate of FIG. 4 at a third depth.

FIG. 17 depicts a removed section view of the faceplate of FIG. 4 at a third depth. In this view, the section plane depth is deep enough that second channels 140 intersect the section plane, as well as the transition regions 148 of the first channels 138. As can be seen, the transition regions 148 fluidly connect the rest of the first channels 138 to the gas distribution channel 136. The transition regions 148 may be generally located in between the outermost second channel 140 and the gas distribution channel 136.

Figure 19:
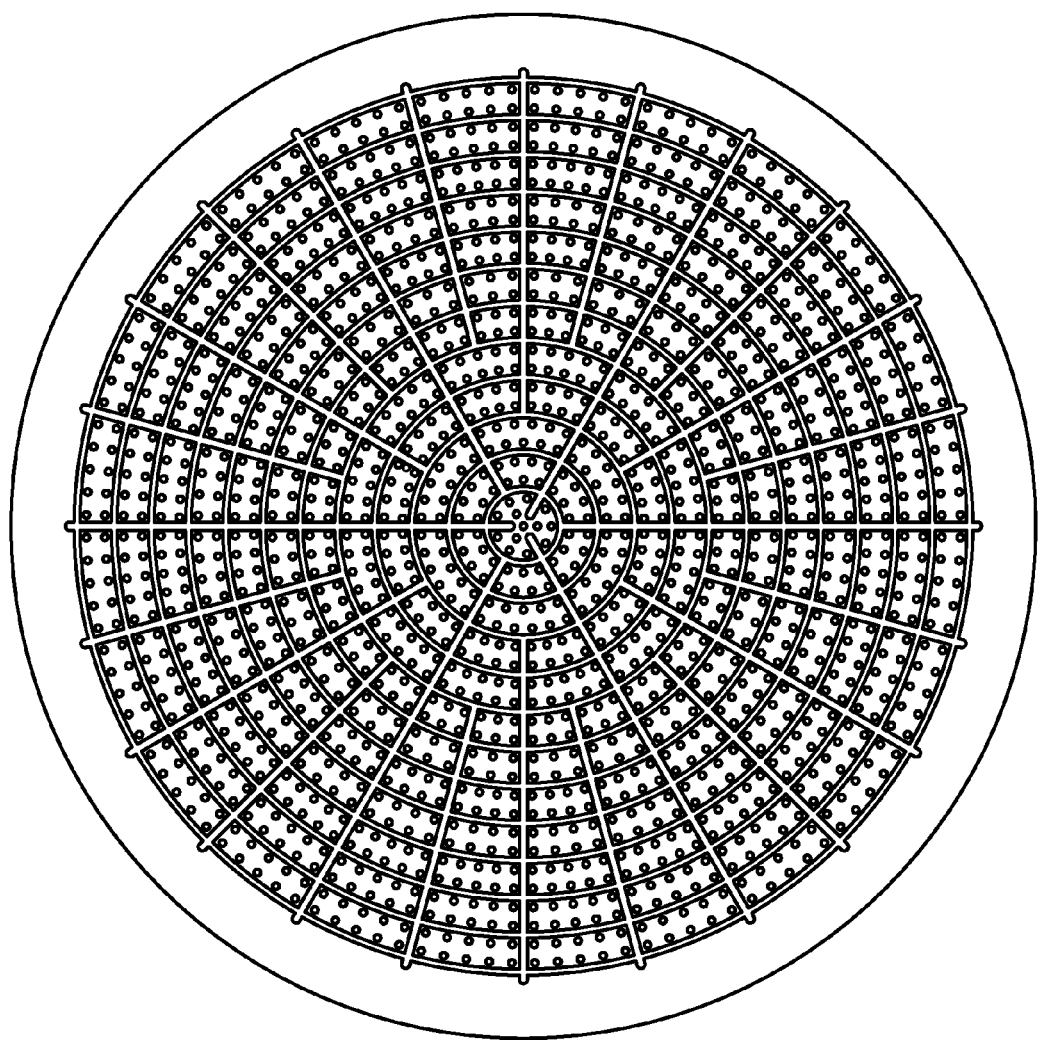
FIG. 19 depicts a removed section view of the faceplate of FIG. 4 at a fourth depth.

FIG. 19 depicts a removed section view of the faceplate of FIG. 4 at a fourth depth. This view is nearly identical to the section shown in FIG. 16 except that the first channels at this depth extend somewhat beyond the outermost second channel 140. This allows the gas flow 152 entering the first channels 138 to expand somewhat from the conditions in the transition regions 148 prior to encountering the outermost second channel 140.

Various relationships between some of these features are now discussed. Dual plenum showerheads using faceplates such as the implementations shown in the figures discussed above may be used to provide substantially uniform gas flows (of gases from both plenums) across a wafer being processed using the faceplate. To promote such uniformity, features may constrain aspects of other features. For example, the transverse cross-sectional area of each of the transition regions 148 may be configured to be less than 10% of the transverse cross-sectional area of the gas distribution channel 136 to which the transition region 148 is fluidly connected divided by the number of gas feed inlets 120 fluidly connected with that gas distribution channel 136. Another constraint that may be used is to limit the transverse cross-sectional area of each transition region 148 to be less than 15% of the maximum transverse cross-sectional area of the first channel 138 for the transition region 148. A further constraint that may be used is to limit the transverse cross-sectional area of each of the first channels 138 to be at least 80% larger than the transverse cross-sectional area of each of the second channels 140.

For example, the transition regions 148 may each have a transverse cross-sectional area of approximately 0.0054 square inches, the first channels 138 may each have a maximum transverse cross-sectional area of approximately 0.057732 square inches, and the second channels 140 may each have a transverse cross-sectional area of approximately 0.0278 square inches.

Figure 20:
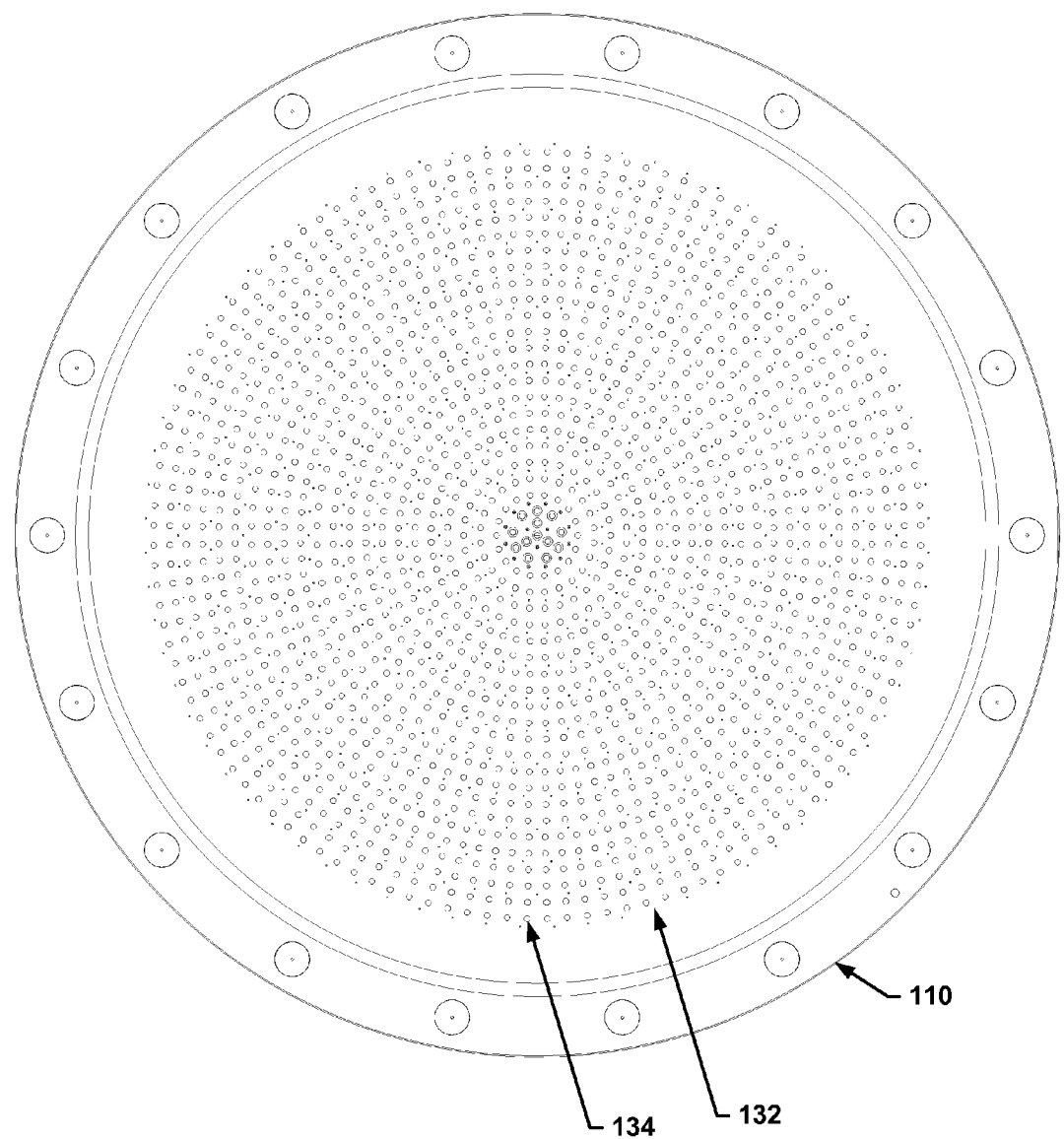
FIG. 20 depicts a plan view of an example faceplate.
Figure 21:
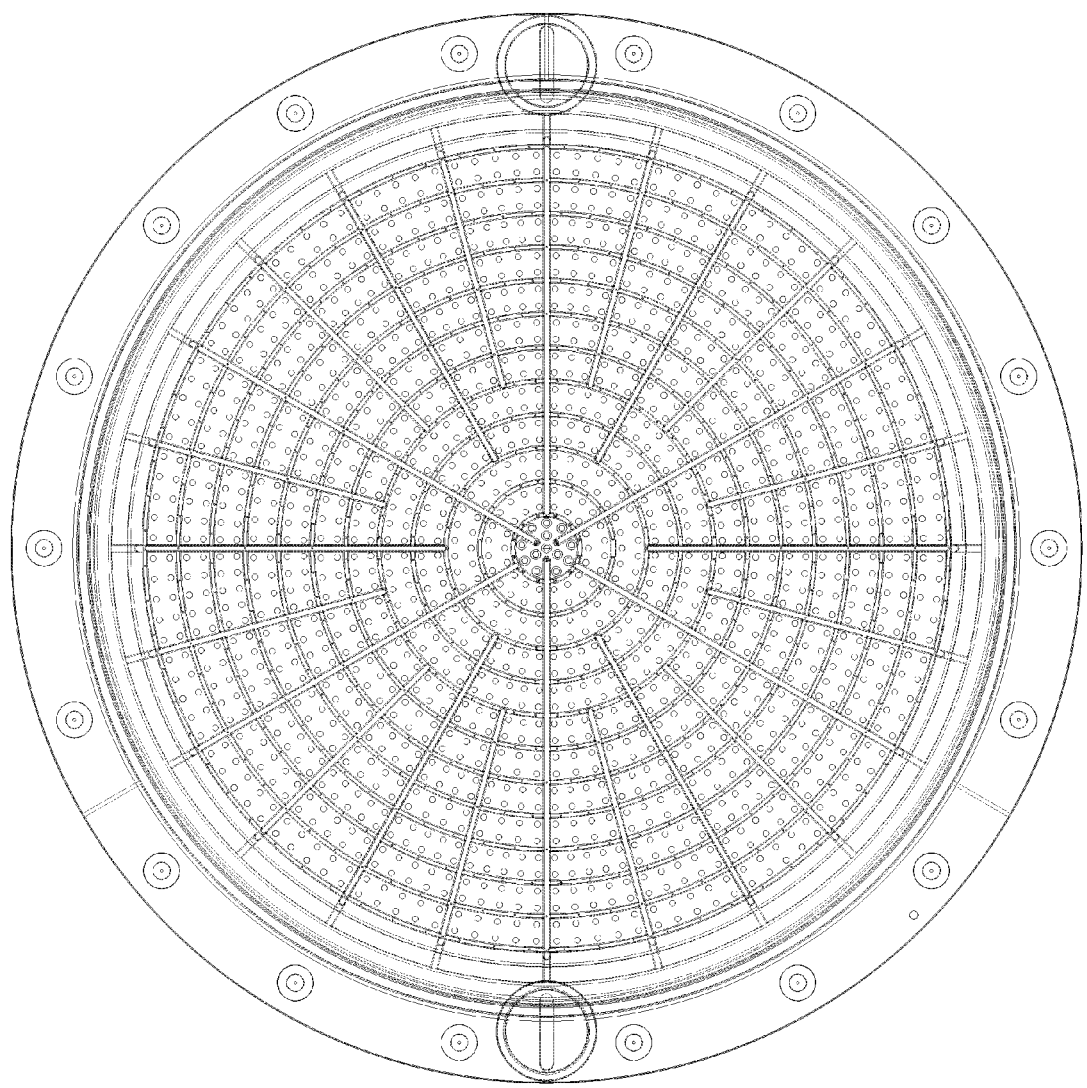
FIG. 21 depicts a plan view of an example faceplate with internal features shown by dotted lines.

As discussed, the first gas distribution holes and the second gas distribution holes may be substantially evenly distributed across the face of the faceplate facing the wafer during processing. FIG. 20 depicts a plan view of the faceplate 110. FIG. 21 depicts a plan view of the faceplate 110 with dotted lines showing hidden internal features, such as the first channels and the second channels. As can be seen, the first gas distribution holes 132 and the second gas distribution holes 134 are substantially evenly distributed across the face of the faceplate 110 (at least, within a particular region generally corresponding to the wafer diameters that the showerhead is designed for).

The implementation shown in the majority of the Figures discussed above is configured for use with 300 mm semiconductor wafers. Additional implementations for larger-sized wafers, e.g., 450 mm wafers, are also contemplated. Such additional implementations may conform to the general design principles discussed above while being dimensionally different due to the larger wafer size. Various parameters may also be adjusted depending on the specific application in which the showerhead may be used. For example, if free radicals are not used, the second gas distribution holes may be considerably smaller in diameter than in the discussed implementation.

While such dual-plenum showerheads have been described as being useful for distributing plasmas and free radicals from a remote plasma source in one plenum while simultaneously delivering other process gases via a different plenum, such dual-plenum showerheads may also be used to deliver other combinations of different gases. For example, a purge gas such as argon may be delivered via the first plenum while a process gas is delivered via the second plenum.

The apparatus/process described hereinabove may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically comprises some or all of the following steps, each step enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper. Further, the disclosed apparatus may be used in a process with lithography and/or patterning processes preceding or following the disclosed methods.

In some implementations, the dual-plenum showerhead may be installed in a reactor and linked to a system controller having instructions for controlling process operations. The system controller will typically include one or more memory devices and one or more processors configured to execute the instructions so that the apparatus will perform various semiconductor fabrication processes. Machine-readable media containing instructions for controlling process operations may be coupled to the system controller. The processors may include a CPU or computer and may include or be communicatively connected with one or more analog and/or digital input/output connections, stepper motor controller boards, etc. The system controller, for example, may be configured to control gas delivery to the dual-plenum showerhead, pedestal movement, vacuum port suction to evacuate gas from the reactor, power and frequency to the plasma electrodes, and/or heating and cooling elements, if present in a particular implementation.

Typically there will be a user interface associated with the system controller. The user interface may include a display screen, graphical software displays of the apparatus and/or process conditions, and user input devices such as pointing devices, keyboards, touch screens, microphones, etc. The system controller may be connected to any or all of the components shown in of a tool or module, including those shown in the Figures of this application; the system controller's placement and connectivity may vary based on the particular implementation.

In certain implementations, the system controller controls the pressure in the processing chambers. The system controller may also control the concentration of various process gases in the chamber by regulating valves, liquid delivery controllers, and MFCs in the delivery system as well as flow restriction valves in an exhaust line. The system controller executes system control software including sets of instructions for controlling the timing, flow rates of gases and liquids, chamber pressure, chamber/showerhead/pedestal/substrate temperature, and/or other parameters of a particular process. Other computer programs stored on memory devices associated with the controller may be employed in some implementations. In certain implementations, the system controller controls the transfer of a substrate into and out of the various apparatuses shown in the figures.

The computer program code for controlling the processes in a process sequence can be written in any conventional computer readable programming language: for example, assembly language, C, C++, Pascal, Fortran or others. Compiled object code or script is executed by the processor to perform the tasks identified in the program. The system software may be designed or configured in many different ways. For example, various chamber component subroutines or control objects may be written to control operation of the chamber components necessary to carry out the described processes. Examples of programs or sections of programs for this purpose include process gas control code, pressure control code, and plasma control code.

The controller parameters relate to process conditions such as, for example, timing of each operation, pressure inside the chamber, substrate temperature, process gas flow rates, RF power, as well as others described above. These parameters are provided to the user in the form of a recipe, and may be entered utilizing the user interface. Signals for monitoring the process may be provided by analog and/or digital input connections of the system controller. The signals for controlling the process are output on the analog and digital output connections of the apparatus.

Although several implementations of this invention have been described in detail herein with reference to the accompanying drawings, it is to be understood that the invention is not limited to these precise implementations, and that various changes and modifications may be effected therein by one skilled in the art without departing from the scope of spirit of the invention as defined in the appended claims.

We claim:

1. A faceplate for use in semiconductor processing showerhead, the faceplate comprising:
a volume with an outer surface, a top surface, a bottom surface, and a center axis, wherein the top surface and the bottom surface:
partially bound the volume,
are substantially parallel to, and offset from, each other, and
are substantially centered on, and normal to, the center axis, and
wherein the outer surface at least partially bounds the volume in a radial direction with respect to the center axis;
a plurality of first channels within the volume extending from the outer surface towards the center axis, each first channel having a first end closer to the center axis than a second end of that first channel;
a plurality of first gas distribution holes, each first gas distribution hole fluidly connected within the volume to one or more of the first channels and extending through the bottom surface and not extending through the top surface;
a plurality of second gas distribution holes, each second gas distribution hole extending through the top surface and the bottom surface and not fluidly connected within the volume to the first channels; and
one or more gas distribution channels fluidically connected with the second ends of the plurality of first channels, following a path around substantially all of the second gas distribution holes and around all of the second ends of the first channels, and configured to be fluidically connected with one or more gas feed inlets.

2. The faceplate of claim 1, further comprising:
a plurality of second channels within the volume, each second channel:
travelling in a substantially circumferential direction with respect to the center axis, and
fluidly connected within the volume to at least one first channel.

3. The faceplate of claim 2, wherein the second channels are concentric annular channels centered on the center axis.

4. The faceplate of claim 3, wherein the radial spacing between each set of neighboring second channels is substantially the same.

5. The faceplate of claim 1, wherein two or more of the first channels extend into the volume towards the center axis by different amounts.

6. The faceplate of claim 5, wherein the first channels extend into the volume towards the center axis along substantially radial paths.

7. The faceplate of claim 1, wherein each second gas distribution hole is chamfered where the second gas distribution hole intersects the top surface and where the second gas distribution hole intersects the bottom surface.

8. The faceplate of claim 1, wherein:
the first channels have a first average transverse cross-sectional area along their length,
the second channels have a second average transverse cross-sectional area along their length, and
the first average transverse cross-sectional area is substantially larger than the second average transverse cross-sectional area.

9. The faceplate of claim 8, wherein the first average transverse cross-sectional area is at least 80% larger than the second average transverse cross-sectional area.

10. The faceplate of claim 1, wherein each of the first channels is fluidly connected with one of the one or more gas distribution channels through a transition region of the first channel.

11. The faceplate of claim 10, wherein the transverse cross-sectional area of the transition region of each first channel is substantially less than the average transverse cross-sectional area of the first channel.

12. The faceplate of claim 6, wherein:
there are 24 first channels,
the first channels are arranged in a radial pattern about the center axis with substantially equal spacing.

13. The faceplate of claim 12, wherein:
the plurality of first gas distribution holes and the plurality of the second gas distribution holes are distributed across a substantially circular region of the bottom surface, the substantially circular region having a nominal radius R, the first channels in a first subgroup of the first channels terminate at distances between 0% and 20% of R from the center axis, the first channels in a second subgroup of the first channels terminate at distances between 15% and 35% of R from the center axis, the first channels in a third subgroup of the first channels terminate at distances between 30% and 50% of R from the center axis, the first channels in the first subgroup are arranged in a radial pattern about the center axis with substantially equal spacing, the first channels in the second subgroup are arranged in a radial pattern about the center axis with substantially equal spacing, and the first channels in the third subgroup are arranged in a radial pattern about the center axis with substantially equal spacing.

14. The faceplate of claim 11, wherein the transverse cross-sectional area of each transition region is less than 10% of the transverse cross-sectional area of the gas distribution channel with which the transition region is fluidly connected multiplied by the number of the first channels fluidly connected with that gas distribution channel divided by the number of the gas feed inlets fluidly connected with that gas distribution channel.

15. The faceplate of claim 14, wherein the transverse cross-sectional area of each transition region is less than 15% of the transverse cross-sectional area of the first channel for the transition region.

16. The faceplate of claim 1, wherein:

the first gas distribution holes are distributed in a pattern with substantially uniform density across the bottom surface, and the second gas distribution holes are distributed in a pattern with substantially uniform density across the bottom surface.

17. The faceplate of claim 1, further comprising:

a first component, the first component including the top surface and a component bottom surface opposite the top surface; and a second component, the second component including the bottom surface and a component top surface opposite the bottom surface, wherein:

the component bottom surface and the component top surface are mated together, the first channels are formed by features in the component top surface, features in the component bottom surface, or features in both the component top surface and the component bottom surface, and the first gas distribution holes are formed in the second component and extend through the component top surface.

18. The faceplate of claim 17, wherein the first component and the second component include features facilitating the use of threaded fasteners to clamp the first component to the second component in order to mate the component bottom surface and the component top surface.

19. The faceplate of claim 17, wherein the component bottom surface and the component top surface are bonded together.

* * * * *